United States Patent
Ding et al.

(10) Patent No.: US 9,362,879 B2
(45) Date of Patent: Jun. 7, 2016

(54) POWER AMPLIFIER (PA) SYSTEM WITH ELECTROTHERMAL FEEDBACK CIRCUITRY FOR PA GAIN CORRECTION

(71) Applicant: RF Micro Devices, Inc., Greensboro, NC (US)

(72) Inventors: Miaofu Ding, Greensboro, NC (US); Robert J. Baeten, Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 28 days.

(21) Appl. No.: 14/484,377

(22) Filed: Sep. 12, 2014

(65) Prior Publication Data

US 2015/0077185 A1 Mar. 19, 2015

Related U.S. Application Data

(60) Provisional application No. 61/878,773, filed on Sep. 17, 2013.

(51) Int. Cl.
| | |
|---|---|
| H03F 3/04 | (2006.01) |
| H03G 3/30 | (2006.01) |
| H03F 1/30 | (2006.01) |
| H03F 3/195 | (2006.01) |
| H03F 3/24 | (2006.01) |

(52) U.S. Cl.
CPC ................ *H03G 3/30* (2013.01); *H03F 1/302* (2013.01); *H03F 3/195* (2013.01); *H03F 3/245* (2013.01); *H03G 3/3042* (2013.01); *H03F 2200/447* (2013.01)

(58) Field of Classification Search
CPC .............................. H03F 2200/468; H03F 3/04
USPC .......................................... 330/285, 289, 296
See application file for complete search history.

(56) References Cited

U.S. PATENT DOCUMENTS 6,130,581 A * 10/2000 Nevin ..................... H03F 1/301
                                                                330/285

OTHER PUBLICATIONS

Moon, Sang-Woong, "Static and Dynamic Error Vector Magnitude Behavior of 2.4-GHz Power Amplifier," IEEE Transactions on Microwave Theory and Techniques, vol. 55, No. 4, Apr. 2007, pp. 643-647.

* cited by examiner

*Primary Examiner* — Steven J Mottola
(74) *Attorney, Agent, or Firm* — Withrow & Terranova, P.L.L.C.

(57) ABSTRACT

A power amplifier (PA) system with PA gain correction is disclosed. The PA system includes a PA having a bias voltage input; and electrothermal feedback circuitry coupled to the bias voltage input. The electrothermal feedback circuitry is configured to receive thermal feedback generated by the PA and maintain a substantially constant PA gain by automatically changing a bias voltage level at the bias voltage input based upon the thermal feedback.

20 Claims, 9 Drawing Sheets

POWER AMPLIFIER (PA) SYSTEM WITH ELECTROTHERMAL FEEDBACK CIRCUITRY FOR PA GAIN CORRECTION

RELATED APPLICATIONS

This application claims the benefit of U.S. provisional patent application No. 61/878,773, filed Sep. 17, 2013, the disclosure of which is incorporated herein by reference in its entirety.

FIELD OF THE DISCLOSURE

The present disclosure relates to automatic gain control of power amplifiers (PAs). More particularly, the present disclosure provides electrothermal feedback to correct power gain of PAs during long burst and short burst operation.

BACKGROUND

Dynamic error vector magnitude (DEVM) is an important customer specification of wireless local area network (WLAN) power amplifiers (PAs). It is defined as the DEVM of the PA operated below unity duty cycles. In this operation, the PA is turned on and off and its on-off time depends on the duty cycle as well as the burst length. When a PA is pulsed-on, the temperature of the PA cells increases over the burst due to power dissipation and then decreases when the PA is pulsed-off. FIG. 1 illustrates this situation and shows a typical corresponding temperature fluctuation profile of the PA cells. While the temperature changing during PA idle does not affect DEVM, the temperature increase during PA on causes the PA power gain, as well as its bias point during the burst, to deviate from their initial values. Both of these result in the final gain of the PA drifting gradually away from its initial value. For example, FIG. 2 shows a typical WLAN PA gain profile over the burst. If the WLAN system is aware of this gain deviation via amplitude tracking, the gain can be corrected, but only while consuming extra system computing power. However, in order to save system power and reduce system complexity, most customers do not implement amplitude tracking. Thus, any gain correction in such a system must hold constant by way of the PA level in order to yield good DEVM. In practice however, this is a relatively challenging task since the temperature and gain profiles of a PA cell depend not only on various electrical parameters such as bias, and various thermal parameters such as the layout, but also depend on RF power level. FIG. 1 is a graph showing a corresponding temperature fluctuation profile for related art PA cells. The temperature of a PA cell typically follows a first order heating and cooling cycle with each pulse of regulated voltage VREG and radio frequency input (RFIN). FIG. 2 is a graph showing a typical related art wireless local area network (WLAN) power amplifier (PA) gain profile over a data burst. The PA typically deviates from the ideal PA gain with each pulse of regulated voltage VREG and RFIN. Furthermore, the PA gain profile is also dependent on the pulse length making it even more challenging to design a WLAN PA DEVM-compatible with various 802.11 standards over a wide range of burst lengths.

FIG. 3 is a schematic of a related art PA system 10 that includes a speed-up circuit 12 used to control the burst gain profile of a PA 14 in order to improve dynamic error vector magnitude (DEVM). The speed-up circuit 12 comprises a resistor RS1 coupled between the regulated voltage VREG and a generic PA bias circuit 16 having a bias output 18. A series resistor-capacitor (RC) circuit made up of a second resistor RS2 and a capacitor CS1 is coupled in parallel with the resistor RS1. The related art PA system 10 includes the generic PA bias circuit 16 that receives a collector voltage VCC and the regulated voltage VREG that is modified by the speed-up circuit 12 to become VREG'. The PA 14 includes a bias input 20 that is coupled to the bias output 18. A plurality of bias resistors $R_{B1}$ through $R_{BN}$ are coupled to control inputs of transistors $Q_{CELL\text{-}1}$ through $+Q_{CELL\text{-}N}$. The PA 14 also includes an input IN and a coupling capacitor Cb that is coupled between the input IN and a control of the transistor $Q_{CELL\text{-}1}$. While the PA 14 can be the WLAN type, it is to be understood that the PA 14 can also be other types as well.

FIG. 4 shows the intended result of the operation of the speed-up circuit 12, which is a flat gain for the PA 14. In particular, the speed-up circuit 12 introduces a spike in a VREG' pulse at the beginning of the on cycle, and accordingly a current spike ΔICC in a PA bias output VB. For typical class AB WLAN PAs, such a spike in the bias current will result in a proportional gain spike, ΔG, relative to its original profile (G). The resulting gain profile, G', with the speed-up circuit, is therefore compensated to be a flat profile over a data burst.

By tuning the capacitor CS1 and the resistors RS1 and RS2, the amplitude and shape of AG can be controlled, and hence also the final PA gain profile. However, since there are only three circuit elements in the resistor-capacitor (RC) speed-up circuit 12, the degree/order of pulse shaping is thus limited (in terms of the achievable pulse shape and length). Although the degree/order of pulse shaping can be improved in principle by increasing the number of RC elements in the network, in practical terms this is constrained by the complexity and cost allowed for consumer products with which the PA system 10 is integrated. For example, consumer products are limited by the number of surface mount (SMT) component spots available on a customer board and/or in the PA laminate module (not shown). Also critical is the cost of these additional components. This is especially true since the capacitors required are typically in hundreds of nF ranges. Furthermore, since the compensation is essentially open loop and does not track the root cause of the DEVM issue, which among other lesser factors is due to a temperature pulse profile of the PA cells that make up the PA 14, it is less effective when PA operating conditions such as variations in ambient temperature and output power result in degraded DEVM over temperature and/or power. In fact, this compensation can be less effective even over PA process and SMT component tolerance, potentially resulting in low product yield. The speed-up circuit 12 is also limited in compensating an increasing burst gain profile.

Depending on the design of PA 14, sometimes a WLAN PA may actually behave with a decreasing gain profile and in principle a slow-down circuit 22 shown in FIG. 5 may be used in place of the speed-up circuit 12 (FIG. 4). However, the slow-down circuit 22 slows down PA turn-on undesirably and is therefore in conflict with typical PA turn-on time specifications. Thus, the slow-down circuit 22 lacks a solution for WLAN PAs with decreasing burst gain profile. What is needed is a PA system having circuitry that provides PA gain correction for PAs such as a WLAN PA that is DEVM-compatible with various 802.11 standards over a wide range of burst lengths.

SUMMARY

A power amplifier (PA) system with PA gain correction is disclosed. The PA system includes a PA having a bias voltage input; and electrothermal feedback circuitry coupled to the bias voltage input. The electrothermal feedback circuitry is configured to receive thermal feedback generated by the PA and maintain a substantially constant PA gain by automatically changing a bias voltage level at the bias voltage input based upon the thermal feedback.

In at least one embodiment, the PA system further includes a PA bias circuit having a bias output communicatively coupled to the bias voltage input of the PA, wherein the PA bias circuit is configured to generate a bias voltage level that is automatically modifiable by the electrothermal feedback circuitry to substantially maintain a constant PA gain based upon thermal feedback of heat generated by the PA.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 6:
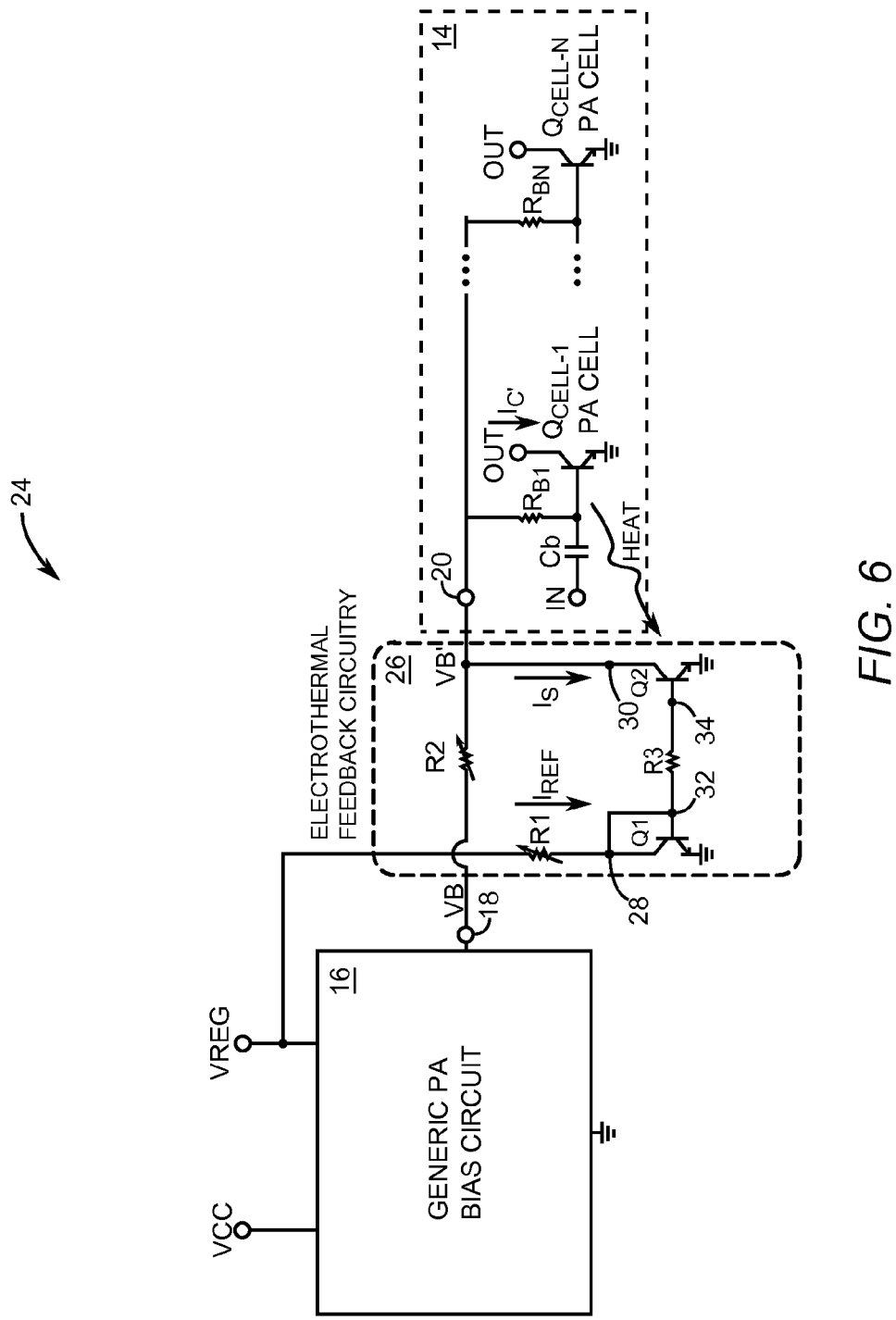
FIG. 6 is a schematic of a PA system that in accordance with the present disclosure includes electrothermal feedback circuitry configured to improve gain burst profile flatness over time as well as DEVM of WLAN PAs.

FIG. 6 is a schematic of a power amplifier (PA) system 24 that in accordance with the present disclosure includes electrothermal feedback circuitry 26 configured to improve gain burst profile flatness over time as well as dynamic error vector magnitude (DEVM) of wireless local area networks (WLAN) PAs.

A transistor Q1 is a reference device and is thermally de-coupled from the PA cells making up the PA 14. A reference electrical current $I_{REF}$ that flows through a resistor R1 during operation is set by the size of the transistor Q1 as well as the value of resistance of resistor R1. The resistor R1 is coupled between the regulated input VREG and a current input 28 of the transistor Q1. Another transistor Q2 is a sensor device that is thermally coupled with the PA cells of PA 14. A second resistor R2 is coupled between the bias output 18 of the generic PA bias circuit 16 and the bias input 20 of the PA 14. The second resistor R2 limits the current flowing to the bias input 20 of the PA 14. The resistor R1 and the second resistor R2 can be the variable resistance type to allow adjustable resistance control to compensate for variability in manufacturing processes, etc. A current input 30 of the transistor Q2 is coupled to the bias input 20 of the PA 14. Control input 32 of transistor Q1 and the control input 34 of transistor Q2 are coupled together via a third resistor R3, and the control input 32 of the transistor Q1 is coupled to the current input 28 of the transistor Q1 in a self-bias configuration. The transistor Q2 converts, together with transistor Q1, the temperature profile of the PA cell into an electrical current $I_s$ that is proportional to and substantially in the shape of an increasing temperature profile of the PA cells of PA 14. That is, $$I_s = \alpha Tc, \qquad \text{EQ. 1}$$

where Tc is the PA cell temperature profile over the burst and α is some positive proportionality constant, which can be shown to be dependent on R1, R3 and the size of Q1 and Q2. The electrical current $I_s$ is then converted into PA cell bias voltage VB via a small series resistor, R2, between the generic PA bias circuit and the PA cell as $$\Delta VB = VB' - VB = -i_s R2 = -\alpha Tc R2, \qquad \text{EQ. 2}$$

where VB is the bias voltage immediately after the generic PA bias, VB' is the bias voltage for the PA cells and ΔVB is the change of the PA bias voltage due to $I_s$. If we assume the small change of ΔVB induce, proportionally, a small change of PA cell gain, i.e.

$$\Delta G = \beta \Delta VB \qquad \text{EQ. 3}$$

where β is some positive proportionality constant and ΔG is the PA gain change due to PA bias change ΔVB, then we have:

$$\Delta G = \beta(-\alpha Tc R2) = (-\alpha\beta r2)Tc. \qquad \text{EQ. 4}$$

Figure 1:
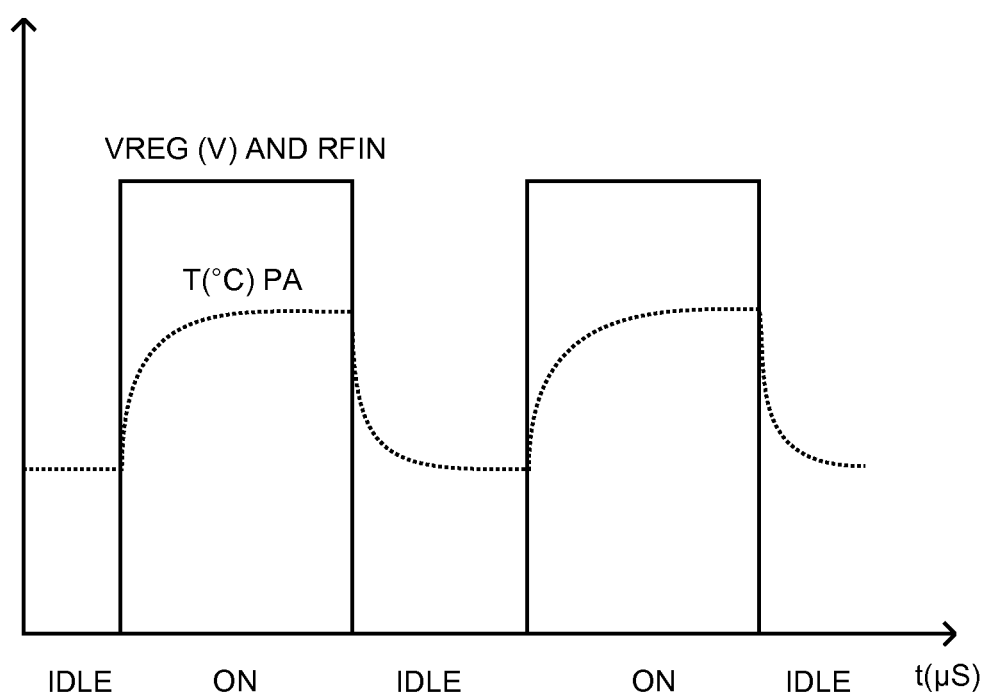
FIG. 1 is a graph showing a corresponding temperature fluctuation profile for related art power amplifier (PA) cells.
Figure 2:
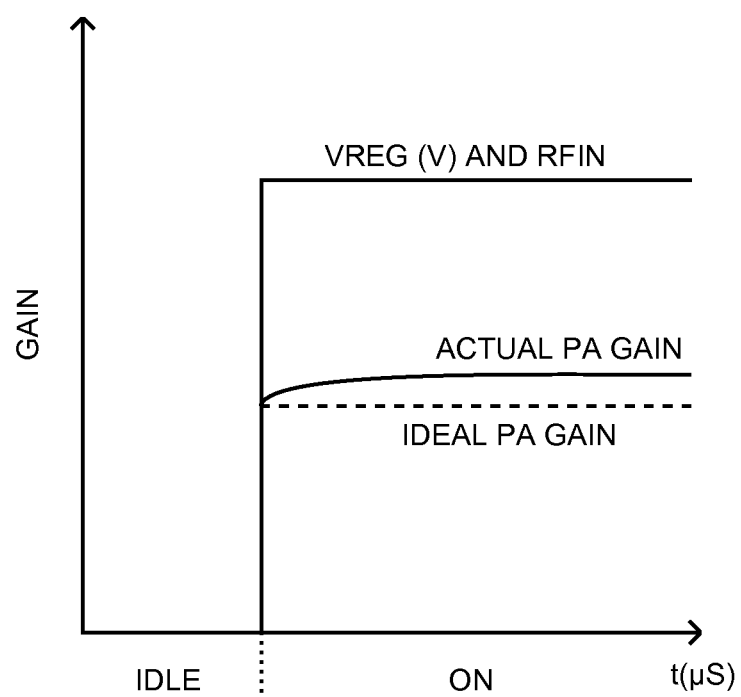
FIG. 2 is a graph showing a typical related art wireless local area network (WLAN) PA gain profile over a data burst.
Figure 3:
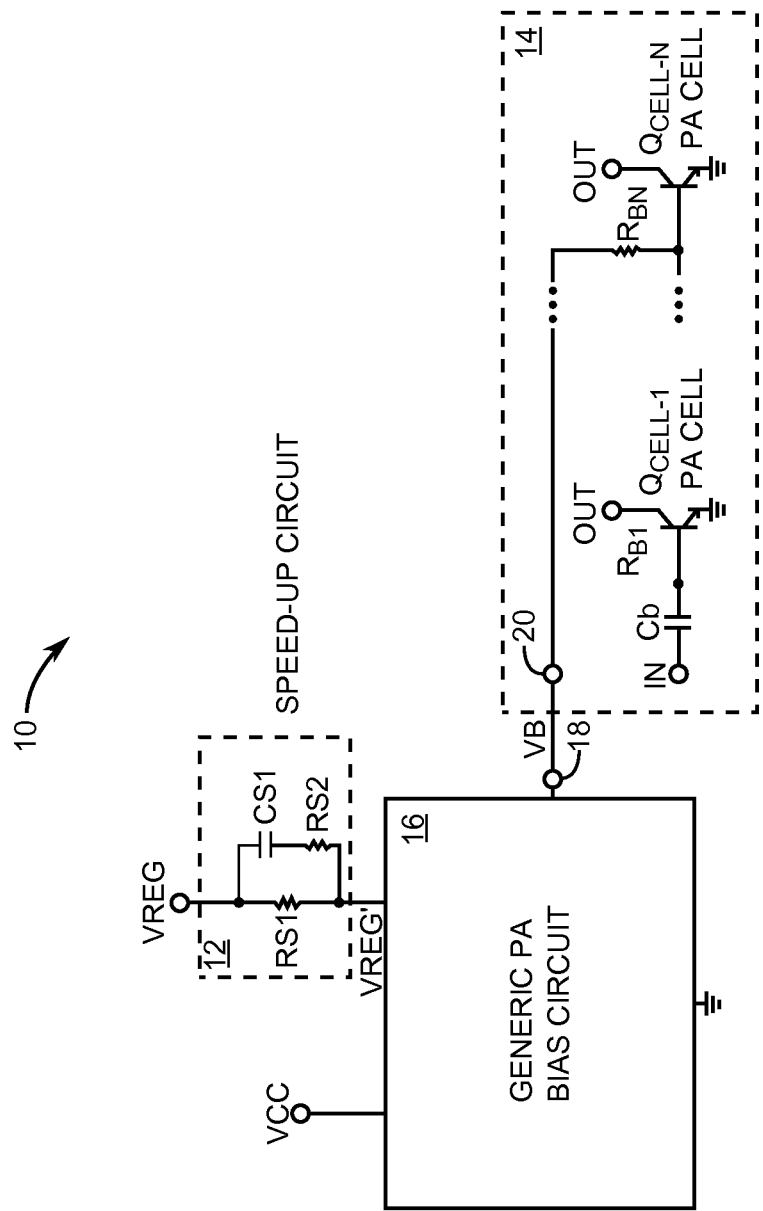
FIG. 3 is a schematic of a related art PA system that includes a speed-up circuit used to control the burst gain profile of a WLAN PA in order to improve dynamic error vector magnitude (DEVM).
Figure 4:
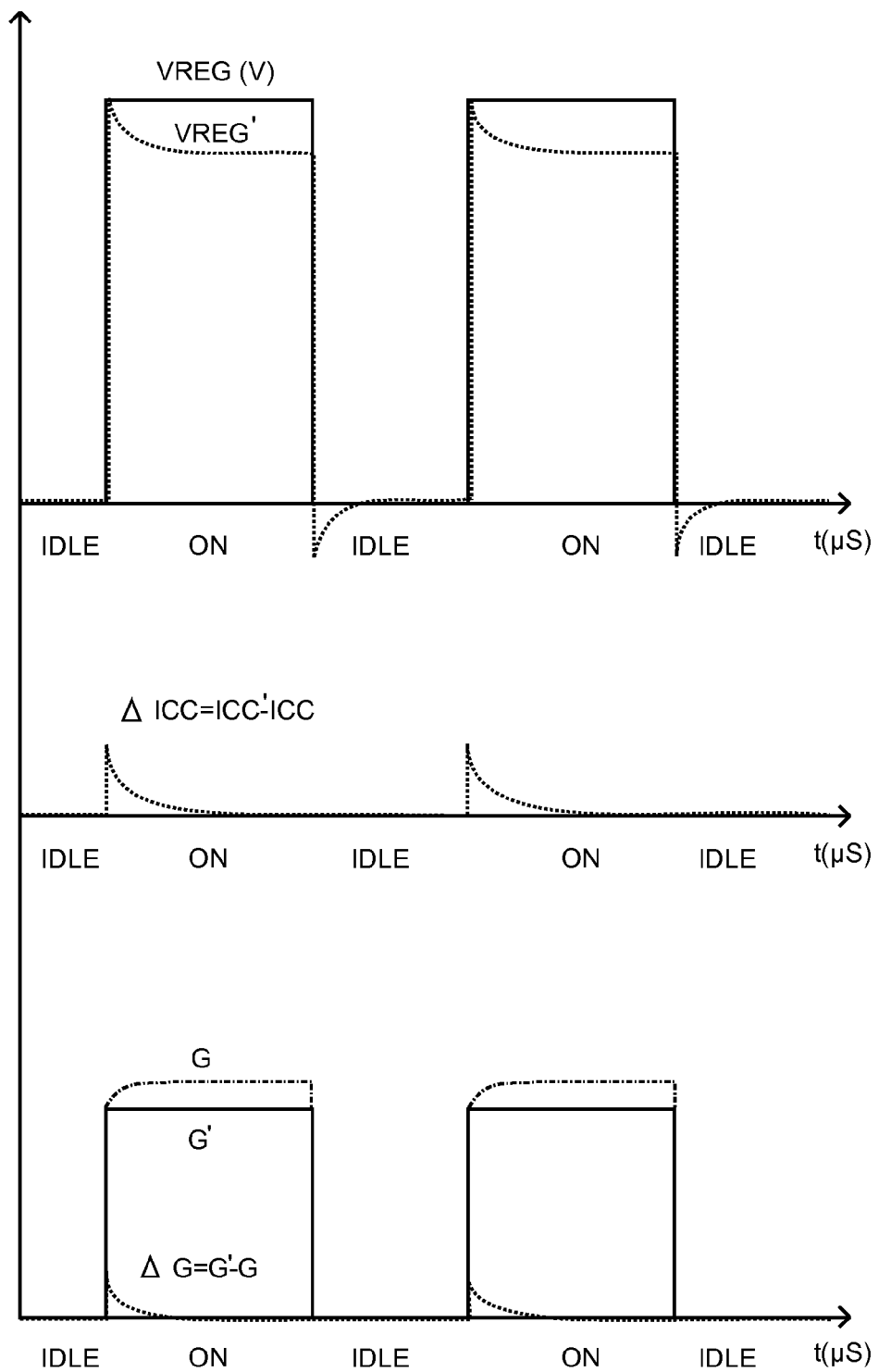
FIG. 4 is a graph showing typical related art pulse waveforms that result from the operation of the speed-up circuit of FIG. 3.

The term ΔG is also referred to as the electrothermal loop gain and ΔG is negative as PA cell temperature rises due to the minus sign in the equation above. As a result, ΔG evaluates as a decreasing gain for an increasing Tc. Furthermore, the magnitude of ΔG can be controlled easily by R2 and/or the proportionality constant α. Since a can be shown to be dependent on R1, R2, R3 and the size of Q1 and Q2, the electrothermal loop gain ΔG can therefore be easily controlled by resistors R1, R2, and R3 along with the size of Q1 and Q2. Thus, by controlling these parameters, a raw PA gain deviation profile such as that shown in FIG. 2 can be compensated by equal and opposite electrothermal loop gain ΔG to yield a flat overall gain profile over the burst. The flat overall gain profile solves the DEVM issue of the WLAN PA.

Unlike related art techniques, the electrothermal feedback circuitry 26 (FIG. 6) directly senses a PA cell temperature deviation profile which is strongly correlated to the raw PA gain profile of the PA cell in terms of both magnitude and shape. Therefore, any conditions that will affect the deviating PA temperature profile, such as the RF power level, process change, as well as the burst length is tracked by the electrothermal feedback circuitry 26. Since the raw PA gain profile is closely related to the PA temperature profile, the electrothermal feedback circuitry 26 is relatively more effective at maintaining flat gain over process, power, and burst length than related art gain control circuitry and techniques. Moreover, the gain control provided by the electrothermal feedback circuitry 26 is free of component tolerances associated with surface mount (SMT) devices. Further still, the electrothermal feedback circuitry 26 does not require the relatively large nF capacitors often needed by related art circuitry and, as a result, needs relatively little die area to implement. By exchanging the reference device that is transistor Q1 and the sensor device that is transistor Q2, the electrothermal feedback circuitry 26 can be reconfigured to yield a positive electrothermal loop gain.

Figure 7:
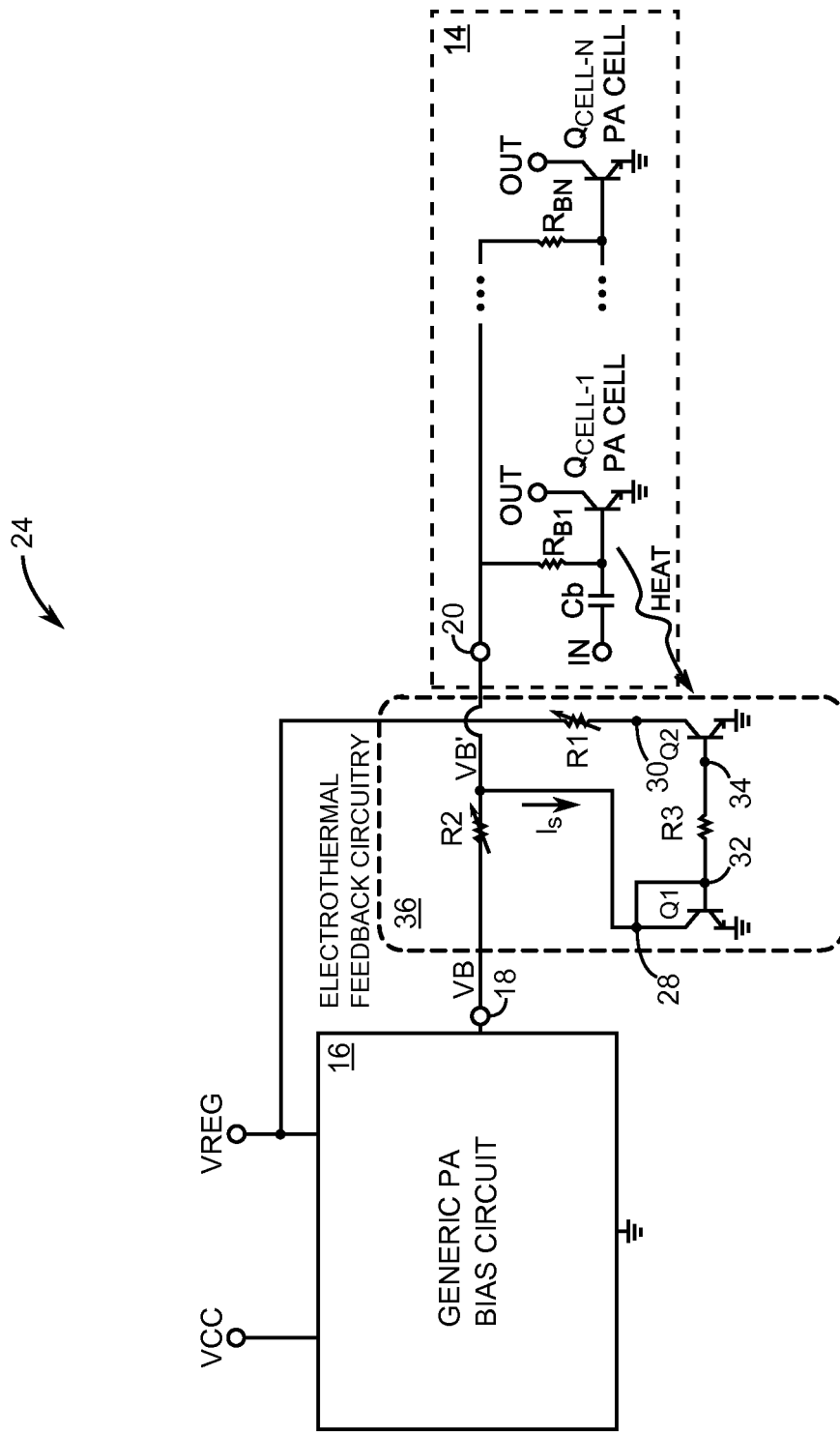
FIG. 7 is a schematic of a PA system that in accordance with the present disclosure includes modified electrothermal feedback circuitry configured to provide positive feedback to compensate for a decreasing profile over a data burst.

FIG. 7 shows a reconfigured electrothermal feedback circuitry 36 that provides a positive loop gain. That is, $$\Delta G = +\gamma Tc, \quad \text{EQ. 5}$$

where $\gamma$ is a positive proportionality constant. Under this modified configuration, the reconfigured electrothermal feedback circuitry 36 is now capable of compensating raw PA gain profile that has a decreasing profile over the burst (i.e., a "drooping" profile).

Figure 5:
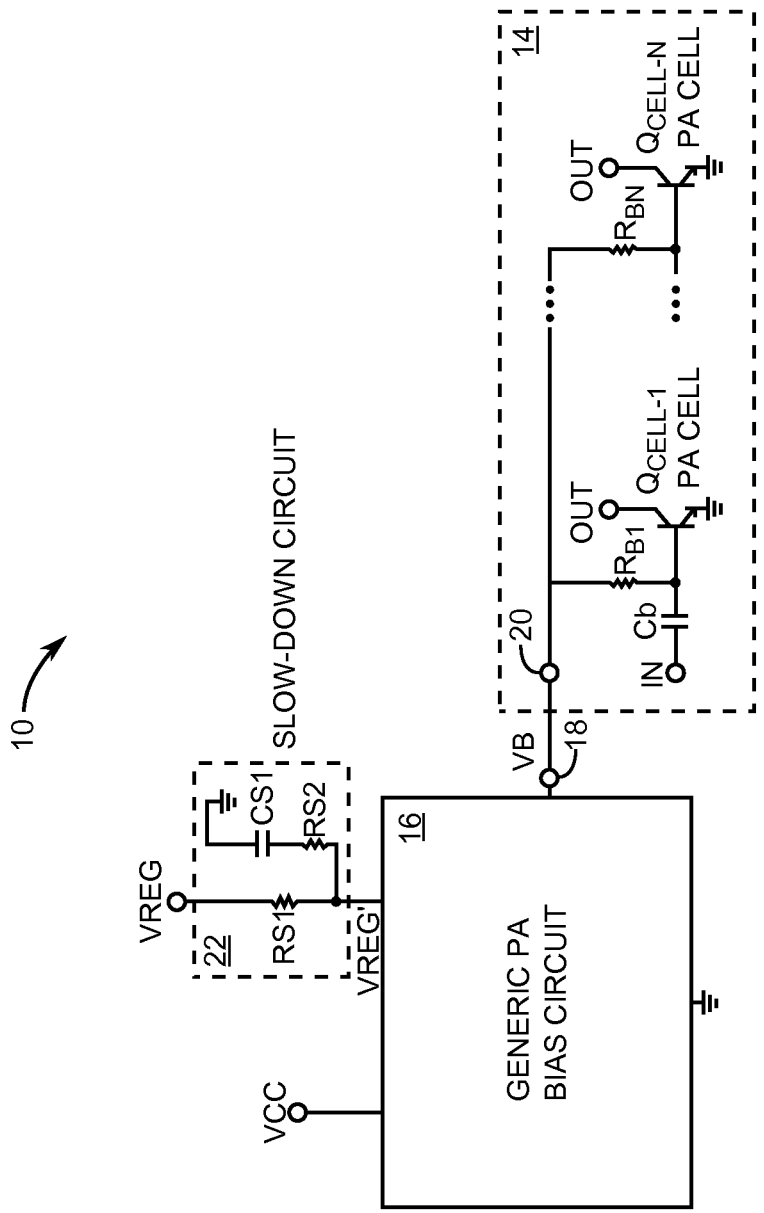
FIG. 5 is a schematic of a related art PA system that includes a slow-down circuit used to control the burst gain profile of a WLAN PA in order to improve DEVM.

Unlike related art techniques such as the slow-down circuit 22 of FIG. 5, the reconfigured electrothermal feedback circuitry 36 does not compromise PA turn on response time, which is more desirable and useful for PAs requiring relatively strict turn-on time specifications. Structurally, the current input of the transistor Q1 is coupled between the series coupling of the resistor R2 and the bias input 20. Moreover, the current input of transistor Q1 and the control input of second transistor Q2 are coupled together in a self-biasing configuration in place of the self-biasing configuration of the transistor Q1 shown in FIG. 6. In this reconfiguration, the transistor Q1 and PA 14 are thermally decoupled, and the second transistor Q2 and PA 14 are thermally coupled.

Figure 8:
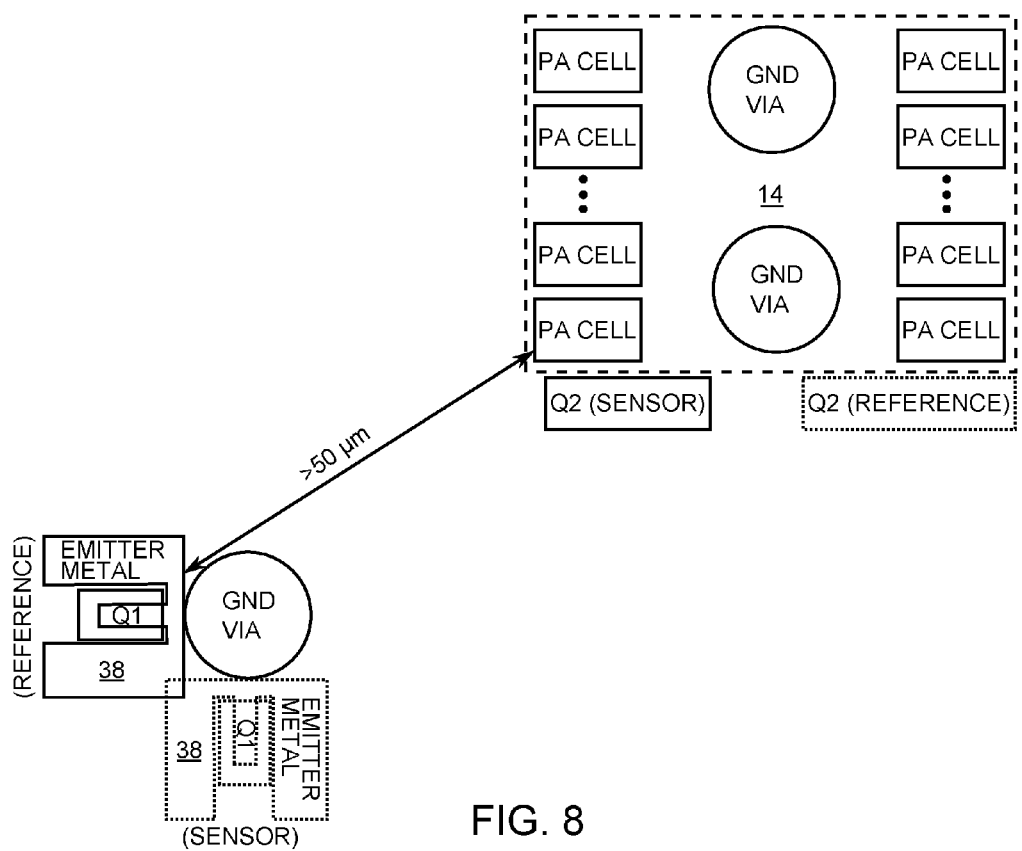
FIG. 8 is a block diagram of an exemplary layout and location of a reference device and sensor device for a PA system.

FIG. 8 is a block diagram of an exemplary layout and location of a reference device and sensor device for a PA system such as the PA system 24 shown in FIG. 6. The layout and location of the reference and sensor devices is a critical and integral part of the electrothermal feedback circuitry 26 disclosure. Moreover, the layout and location of the reference and sensor devices include careful considerations to ensure both effective thermal coupling and de-couplings of the relevant devices and RF decoupling of the electrothermal feedback circuitry 26 circuit from RF path on the die.

It is relatively important to thermally de-couple transistor Q1 from any hot spot on the die, especially from the PA cells of PA 14. A layout procedure of a PA system such as PA 14 (FIG. 6) carefully locates the transistor Q1 on a die where the temperature fluctuation, while the PA is pulsed, is minimal. For example, transistor Q1 is usually placed at a location that is around about at least 50 μm away from any PA cell of PA 14 and is typically placed immediately next to a metallized VIA such as a ground VIA. However, it is to be understood that distance between any PA cell of PA 14 and a thermally coupled or de-coupled device is a variable that is a function of material characteristics and other design criteria that is evaluated on a case by case basis. Thus, the given distance of >50 μm in FIG. 8 is exemplary and not to be interpreted as limiting. Typically, the reference device in this case transistor Q1 is physically coupled to a metallization directly coupled to the reference device. As shown in the exemplary embodiment of FIG. 8, a chunk area of metal 38 can be attached to the emitter of transistor Q1 to further reduce the temperature fluctuations of transistor Q1. The sensor device, transistor Q2, is relatively tightly thermally coupled to the PA cells of PA 14 in order to sense the temperature fluctuation of PA 14. Typically, transistor Q2 is located, but is not limited to, a closest one of the PA cells while complying with layout design rules checking (DRC) rules.

FIG. 8 also depicts a reconfiguration shown in short dashed line wherein the first transistor Q1 is the sensor device and the second transistor is the reference device. By exchanging the reference device that is Q1 and the sensor device that is Q2, the electrothermal feedback circuitry 26 (FIG. 6) can be reconfigured to yield a positive electrothermal loop gain as shown in FIG. 7. In this reconfiguration, the first transistor Q1 and the PA 14 are thermally decoupled, and the second transistor Q2 and the PA 14 are thermally coupled.

Figure 9:
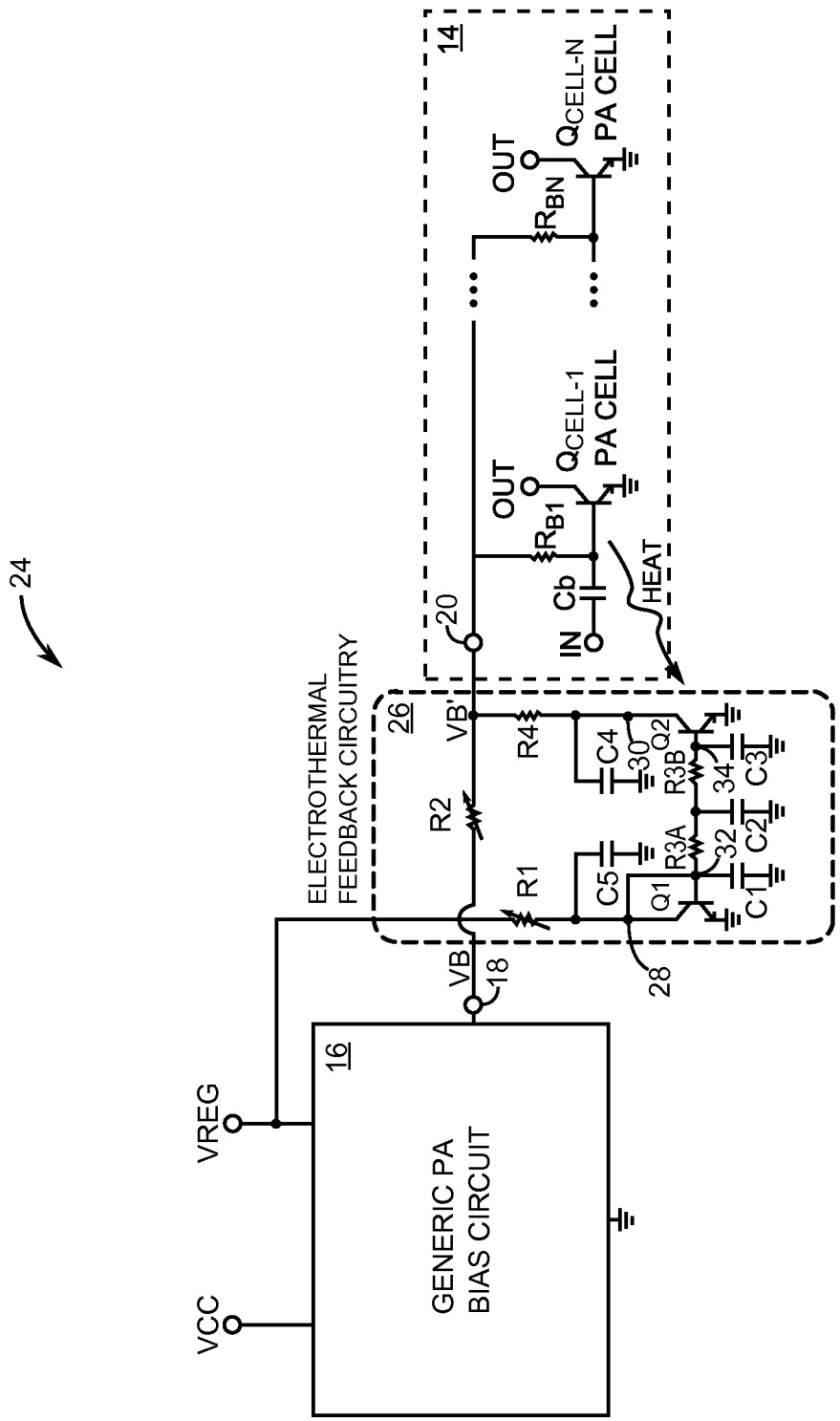
FIG. 9 is a schematic of a PA system that in accordance with the present disclosure includes modified electrothermal feedback circuitry configured to minimize RF coupling between the RF path and the electrothermal feedback circuitry.

It is relatively important to minimize any RF coupling from any RF paths associated with the PA system 24 (FIG. 6). During layout, any opportunity for the interconnection of metals of the electrothermal feedback circuitry 26 to cross over an RF path should be minimized. Jumper wires (not shown) can be used to avoid RF coupling when crossover is otherwise inevitable. In addition, an RF decoupling capacitor should be added to various nodes of the electrothermal feedback circuitry 26 to decouple any unwanted RF energy. If RF coupling is inevitable, RC networks around the electrothermal feedback circuitry 26 can be used appropriately to attenuate coupling and minimize the impact. FIG. 9 schematically depicts RF decoupling capacitors C1, C2, C3, C4, and C5 as well as RC networks at various nodes of the electrothermal feedback circuitry 26 for this decoupling purpose. Depending on the actual layout, all of the capacitors and RC networks shown are not necessary, but those on the hottest node are recommended. To identify the hottest node, electro-magnetic (EM) modeling tools can be used to simulate EM coupling between the electrothermal feedback circuitry 26 and the RF path.

Those skilled in the art will recognize improvements and modifications to the embodiments of the present disclosure. All such improvements and modifications are considered within the scope of the concepts disclosed herein and the claims that follow.

What is claimed is:

1. A power amplifier (PA) system with PA gain correction comprising:
    a PA having a bias voltage input; and
    electrothermal feedback circuitry comprising:
        a first transistor that is thermally decoupled from the PA and physically coupled to a metallization directly coupled to the first transistor; and
        a second transistor that is thermally coupled to the PA to receive thermal feedback of heat generated by the PA, wherein the electrothermal feedback circuitry is coupled to the bias voltage input and configured to maintain substantially a constant PA gain by automatically changing a bias voltage level at the bias voltage input based upon the thermal feedback.

2. The PA system of claim 1 wherein:
    the first transistor is a reference device and the second transistor is a sensor device that are together configured to provide a negative electrothermal loop gain.

3. The PA system of claim 2 wherein the sensor device and the reference device are configured to convert a temperature difference between the sensor device and the reference device into an electrical current that modifies the bias voltage level such that PA gain is substantially maintained at a fixed level during a data burst.

4. The PA system of claim 2 wherein the PA is comprised of PA cells that are fabricated on a die and the reference device is located on the die at least 50 μm from any of the PA cells.

5. The PA system of claim 4 wherein the sensor device is located on the die within at least 25 μm of one of the PA cells.

6. The PA system of claim 2 wherein the reference device is physically coupled to a metallized via.

7. The PA system of claim 1 wherein:
the first transistor is a sensor device and the second transistor is a reference device that are together configured to provide a positive electrothermal loop gain.

8. The PA system of claim 7 wherein the sensor device and the reference device are configured to convert a temperature difference between the sensor device and the reference device into an electrical current that modifies the bias voltage level such that PA gain is substantially maintained at a fixed level during a data burst.

9. The PA system of claim 7 wherein the PA is comprised of PA cells that are fabricated on a die and the sensor device is located on the die at least 50 μm from any of the PA cells.

10. The PA system of claim 7 wherein the reference device is located on the die within at least 25 μm of one of the PA cells.

11. The PA system of claim 7 wherein the sensor device is physically coupled to a metallized via.

12. The PA system of claim 1 further including a PA bias circuit having a bias output communicatively coupled to the bias voltage input of the PA, wherein the PA bias circuit is configured to generate a bias voltage level that is automatically modifiable by the electrothermal feedback circuitry to substantially maintain a constant PA gain based upon thermal feedback of the heat generated by the PA.

13. A method of maintaining constant PA gain:
providing a PA having a bias voltage input;
providing electrothermal feedback circuitry comprising:
a first transistor that is thermally decoupled from the PA and physically coupled to a metallization directly coupled to the first transistor; and
a second transistor that is thermally coupled to the PA to receive thermal feedback of heat generated by the PA, wherein the electrothermal feedback circuitry is coupled to the bias voltage input;
receiving the thermal feedback from the PA via the electrothermal feedback circuitry;
converting a thermal signal into an electrical current signal via the electrothermal feedback circuitry; and
generating a bias voltage level at the bias voltage input that substantially maintains a constant PA gain.

14. The method of maintaining constant PA gain of claim 13 wherein the first transistor is a reference device and the second transistor is a sensor device that are together configured to provide a negative electrothermal loop gain.

15. The method of maintaining constant PA gain of claim 14 wherein the PA is comprised of PA cells that are fabricated on a die and the reference device is located on the die at least 50 μm from any of the PA cells.

16. The method of maintaining constant PA gain of claim 15 wherein the sensor device is located on the die within at least 25 μm of one of the PA cells.

17. The method of maintaining constant PA gain of claim 14 wherein the reference device is physically coupled to a metallized via.

18. The method of maintaining constant PA gain of claim 13 wherein the first transistor is a sensor device and the second transistor is a reference device that are together configured to provide a positive electrothermal loop gain.

19. The method of maintaining constant PA gain of claim 18 wherein the PA is comprised of PA cells that are fabricated on a die and the sensor device is located on the die at least 50 μm from any of the PA cells.

20. The method of maintaining constant PA gain of claim 19 wherein the reference device is located on the die within at least 25 μm of one of the PA cells.

* * * * *